United States Patent [19]

Hotta et al.

[11] Patent Number: 5,119,314
[45] Date of Patent: Jun. 2, 1992

[54] SEMICONDUCTOR INTEGRATED CIRCUIT DEVICE

[75] Inventors: Takashi Hotta; Masahiro Iwamura, both of Hitachi, Japan

[73] Assignee: Hitachi, Ltd., Tokyo, Japan

[21] Appl. No.: 442,301

[22] Filed: Nov. 28, 1989
(Under 37 CFR 1.47)

Related U.S. Application Data

[60] Division of Ser. No. 306,294, Feb. 6, 1989, abandoned, which is a continuation of Ser. No. 14,449, Feb. 13, 1987, abandoned.

[30] Foreign Application Priority Data

Feb. 17, 1986 [JP] Japan .................................. 61-30879

[51] Int. Cl.⁵ ............................................. G06F 15/60
[52] U.S. Cl. ..................................... 364/491; 364/490;
364/489; 364/488; 357/42; 357/43; 307/454;
307/446
[58] Field of Search ............... 364/488, 489, 490, 491;
307/443, 446, 451, 454, 570; 357/34, 42, 43

[56] References Cited

U.S. PATENT DOCUMENTS

| | | | |
|---|---|---|---|
| 4,263,651 | 4/1981 | Donath et al. | 364/491 |
| 4,584,653 | 4/1986 | Chih et al. | 364/491 |
| 4,613,940 | 9/1986 | Shenton et al. | 364/490 |
| 4,616,146 | 10/1986 | Lee et al. | 307/446 |
| 4,638,186 | 1/1987 | McLaughlin | 307/446 |
| 4,649,295 | 3/1987 | McLaughlin et al. | 307/446 |
| 4,686,629 | 8/1987 | Noto et al. | 364/491 |
| 4,839,821 | 6/1989 | Murakata | 364/491 |

FOREIGN PATENT DOCUMENTS

0133131 2/1985 European Pat. Off. .

Primary Examiner—Pharshotam S. Lall
Assistant Examiner—V. N. Trans
Attorney, Agent, or Firm—Antonelli, Terry, Stout & Kraus

[57] ABSTRACT

A semiconductor integrated circuit device which can operate at high speed and involves a low power consumption and a high integration density, wherein a Bi-CMOS basic cell and a Bi-CMOS macro cell are employed to define a critical path and a CMOS basic cell and a CMOS macro cell are employed for a portion of the device other than the critical path.

6 Claims, 8 Drawing Sheets

SEMICONDUCTOR INTEGRATED CIRCUIT DEVICE

This is a divisional of application Ser. No. 306,294, filed Feb. 6, 1989, which is a continuation of application Ser. No. 014,449, filed Feb. 13, 1987, now abandoned.

BACKGROUND OF THE INVENTION

The present invention relates to a semiconductor integrated circuit device incorporating a multiplicity of logic gates. More particularly, the present invention pertains to a semiconductor integrated circuit device which is suitable for achieving a large-scale integration, a low power consumption and a high-speed operation.

Figure 2:
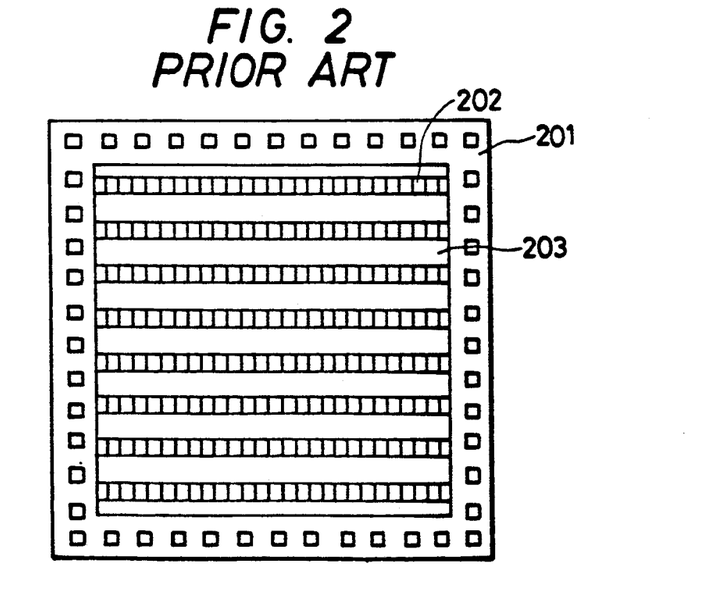
FIGS. 2 to 5 and 9 are views employed to describe prior arts.

As a semiconductor integrated circuit device for realizing a logic consisting of a multiplicity of logic gates, a gate array is widely known. A general arrangement of the gate array is shown in FIG. 2. Rows 202 of basic cells are arrayed on an LSI chip. A region 203 for interconnection, which is known as an interconnection channel region, is provided between each pair of adjacent rows 202 of basic cells. A region for input and output circuits and bonding pads is prepared around the cell array. Logic gates which are prepared in advance are connected in accordance with a logic which is desired to be realized. Logic gates on a logic diagram representing a logic which is desired to be realized are related to basic cells on the gate array and the related basic cells are interconnected according to CAD (Computer Aided Design) in general. The gate array has the advantage that the time required for designing and production thereof can be reduced since the interconnection step alone needs to be customized.

Figure 3:
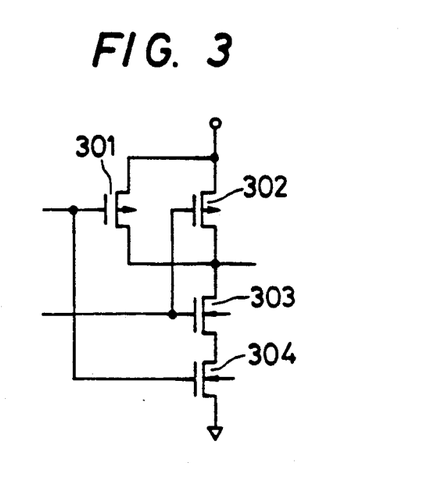

Examples of circuits for basic cells include TTL, ECL, CMOS and Bi-CMOS gate arrays. TTL, ECL and CMOS gate arrays are described in Saburo Muroga "VLSI System Design", Wiley Japan, 1984. An example of the arrangement of a two-input NAND gate in a CMOS gate array is shown in FIG. 3. In this figure, the reference numerals 301, 302 denote PMOS transistors, and 303, 304 denote NMOS transistors. A basic gate in the Bi-CMOS gate array is described in the specification of European Patent Laid-Open No. 0099100 1/1984. An example of the arrangement of a two-input NAND gate in a Bi-CMOS is shown in FIG. 4.

All the TTL, ECL and Bi-CMOS gate arrays described in the above-described literatures are constituted by basic gates and basic cells which are arranged in accordance with one kind of circuit format, and there has heretofore been no gate array in which a plurality of kinds of circuit are mixed together in accordance with a particular purpose.

Figure 4:
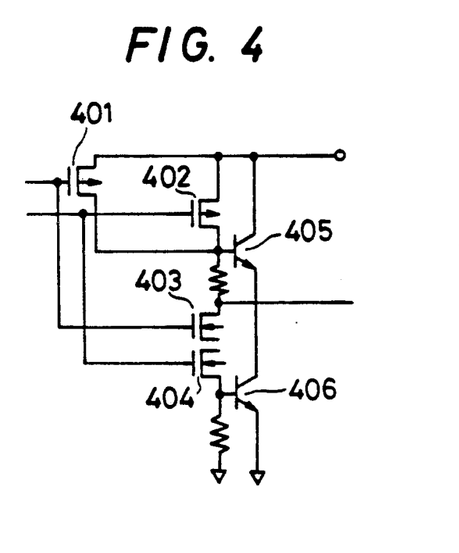

In FIG. 4, the reference numerals 401, 402 denote PMOS transistors, while 403, 404 denote NMOS transistors, and 405, 406 denote NPN transistors.

Figure 9:
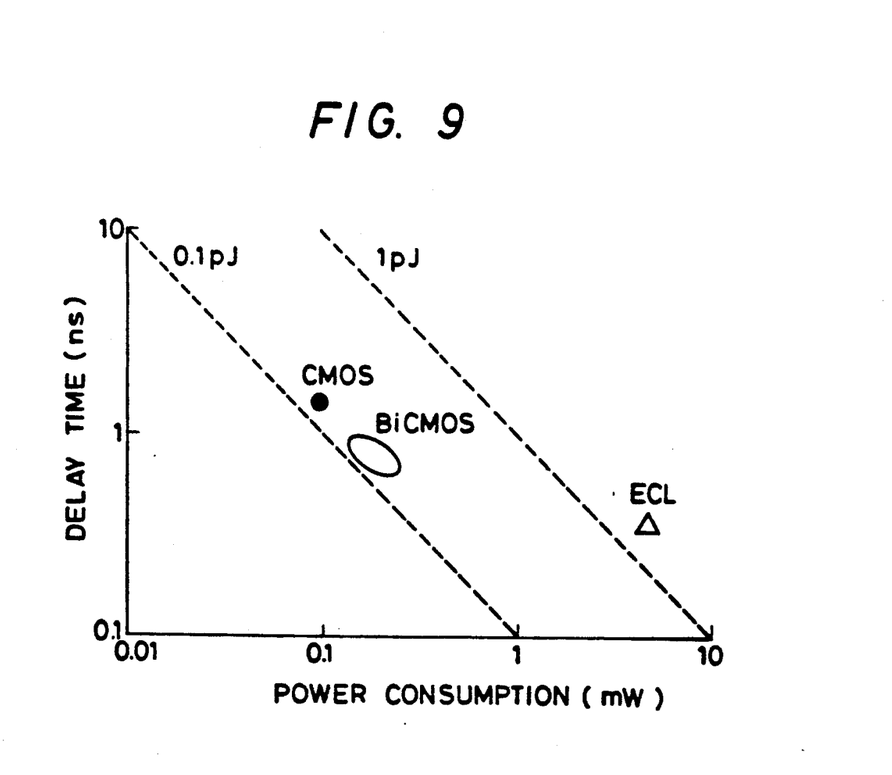

There are three important indexes of performance of integrated circuit devices of the types described above, that is, delay time, power consumption and chip size. The characteristics in regard to delay time and power consumption of ECL, CMOS and Bi-CMOS gates are summarized in FIG. 9. The ECL gate shows the highest speed but has a relatively large power consumption. On the other hand, the CMOS gate has a relatively large delay time but has a power consumption which is about two orders smaller than that of the ECL gate. The Bi-CMOS gate has substantially the same power consumption as that of the CMOS gate but is smaller in delay time than the latter.

Figure 5:
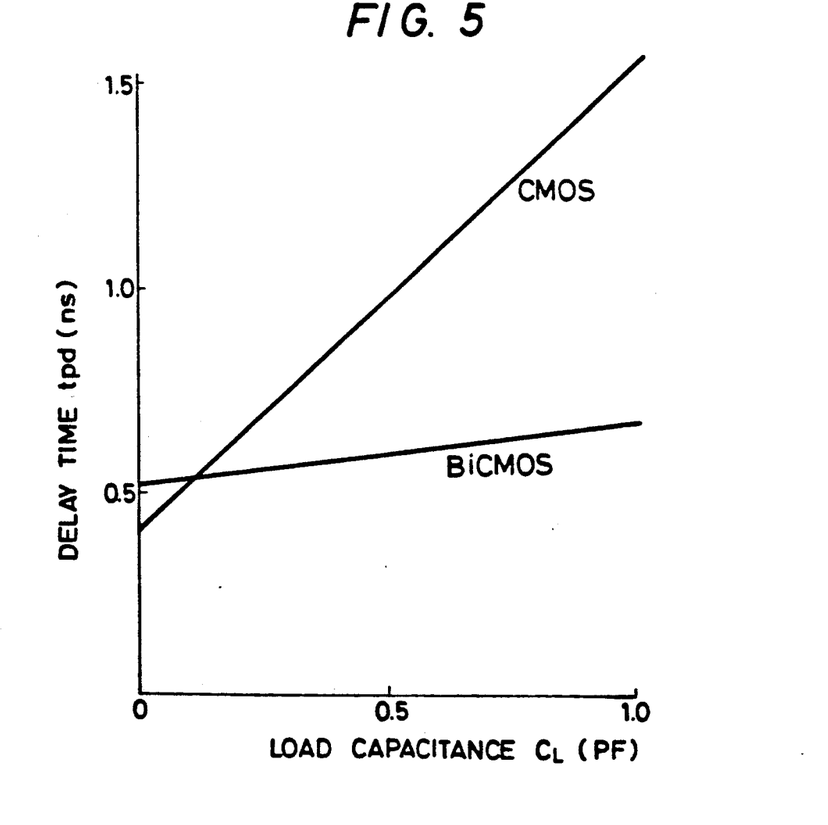

FIG. 5 shows the characteristics in regard to delay time of the Bi-CMOS and CMOS gates. Within a region of relatively low capacitance, the CMOS gate is higher in speed than the Bi-CMOS gate, but in a region of relatively high capacitance the latter is higher in speed than the former. This is because the parasitic capacitance, such as the collector capacitance, of bipolar transistors is larger than that of CMOS transistors although the load driving capacity of the former exceeds that of the latter.

As to the basic cell area, the CMOS gate has the smallest size, and the size of the Bi-CMOS gate is about double that of the CMOS gate, while the size of the ECL gate is several times as large as that of the CMOS gate. In other words, the scale of integration becomes smaller in the order, the CMOS, Bi-MOS and ECL gates.

More specifically, the CMOS basic gate has the largest scale of integration but involves the problem that the operation speed is relatively low when the capacitive load (hereinafter referred to simply as "load") is relatively heavy. The Bi-CMOS basic gate is relatively high in speed when the load is relatively heavy, but the operation speed thereof is lower than that of the CMOS basic gate in a region of relatively light load. In addition, the Bi-CMOS basic gate has the disadvantage that the basic cell area is relatively large and the scale of integration thereof is smaller than that of the CMOS basic gate.

SUMMARY OF THE INVENTION

It is a primary object of the present invention to provide a semiconductor integrated circuit device having a large scale of integration, a low power consumption and a high operation speed.

To this end, the present invention provides a semiconductor integrated circuit device in which a Bi-CMOS basic gate and a CMOS basic gate are mixed together.

In general, the performance of an integrated circuit designed to realize a particular logic is determined by the path among a plurality of paths extending from the input side to the output side which has the largest delay time. Such path is known as a critical path. Accordingly, the above-described object is attained by an arrangement wherein a Bi-CMOS gate is employed as a gate in the critical path and a CMOS gate is employed in another portion of the circuit which has no effect on the performance thereof.

More specifically, employment of a Bi-CMOS gate as a gate which defines a part of the critical path reduces the delay time of the critical path. When all gates which define a critical path have relatively light loads, replacement of the gates with Bi-CMOS gates provides no increase in the operation speed as described above. However, taking the 2 $\mu$m-order technique into consideration, the respective speeds of CMOS and Bi-CMOS gates are the same as each other within a region where the load ranges from 0.1 to 0.2 pF, whereas the standard load of a gate array when actually formed is, e.g., about 0.8 pF. Accordingly, in most cases, replacement of CMOS gates defining a critical path with Bi-CMOS gates attains an increase in the operation speed. On the other hand, employment of a CMOS gate to define a gate in a portion of the circuit other than the critical path enables a reduction in the chip, size without deteriorating the performance.

DETAILED DESCRIPTION OF THE EMBODIMENTS

One embodiment of the present invention will be described hereinunder in detail.

Figure 6:
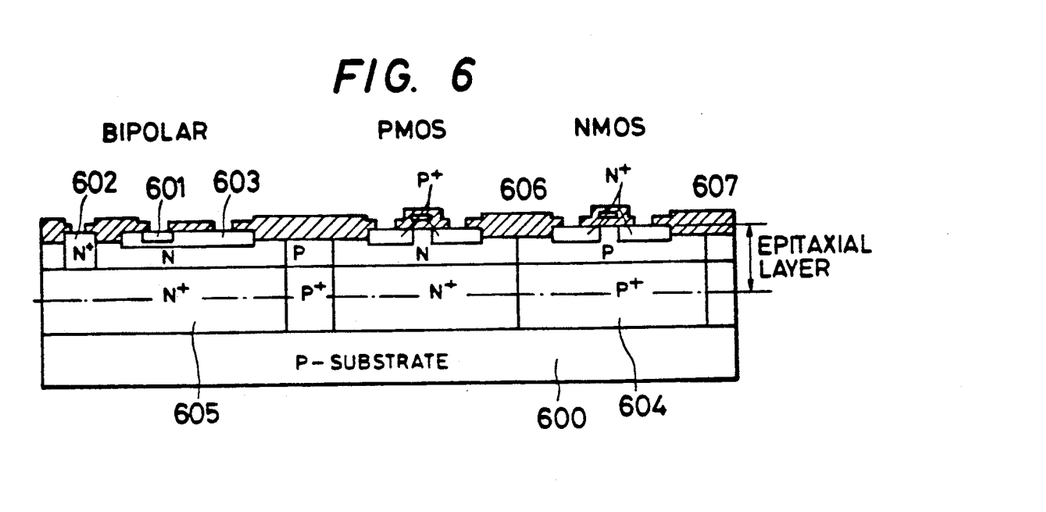

FIG. 6 shows a device structure in which CMOS transistors and bipolar transistors are fabricated on the same one substrate. The reference numeral 605 denotes a heavily-doped N-type buried layer, 604 a heavily-doped P-type buried layer, 601 the emitter region of a bipolar transistor, 603 the base region thereof, and 602 the collector region thereof. Further, the reference numeral 606 denotes the source and drain regions of a PMOS transistor, and 607 the source and drain regions of an NMOS transistor. The numeral 600 denotes a P-type Si substrate.

As shown in FIG. 6, bipolar and MOS transistors can be fabricated on the same one substrate and combined together as desired in a basic circuit. Accordingly, a Bi-CMOS gate such as that shown in FIG. 4 is readily produced on this LSI. In addition, no bipolar transistor may be employed. In such case, a CMOS gate such as that shown in FIG. 3 may be produced on the same substrate using the same process. Further, with this process, Bi-CMOS and CMOS gates can be mixed together in the same circuit.

A variety of logics may be formed on customized LSIs. As one example of such logics, the logic shown in FIG. 7 will be explained below. The reference numerals 701 to 709 denote inputs, and 712 to 719 outputs. The numerals 731 to 739 denote inverters, and 722 to 729 two-input NAND gates. This logic is such that, when the input 701 is "1", all outputs are "1", whereas, when the input 701 is "0", the inputs 702 to 709 appear at the outputs 712 to 719, respectively.

Figure 7:
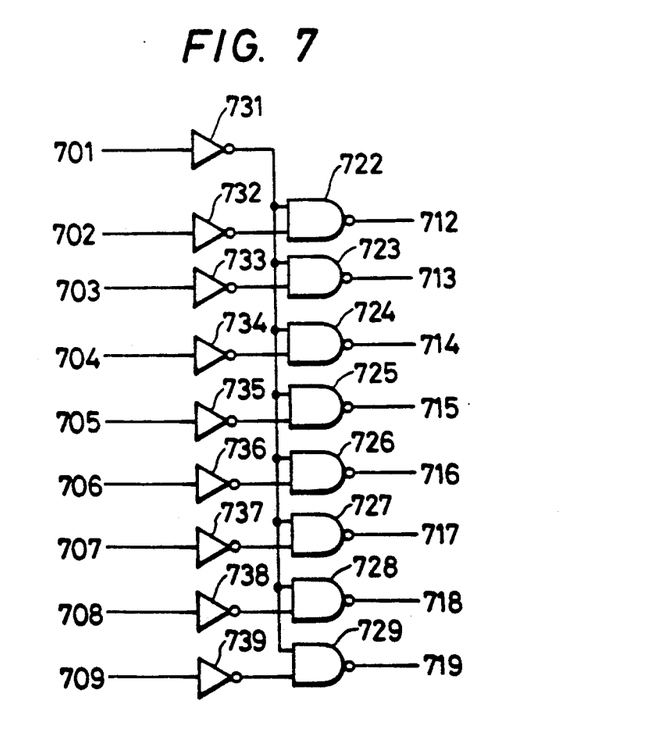

The fan-out of each of the inverters 732 to 739 is 1, whereas the fan-out of the inverter 731 is 8. Accordingly, a critical path in this logic when actually formed on an LSI is defined by a path which extends from the input 701 through the inverter 731 to any one of the two-input NAND gates 722 to 729.

A gate array in which Bi-CMOS and CMOS transistors are mixed together to realize the above-described logic will be explained below.

Figure 1:
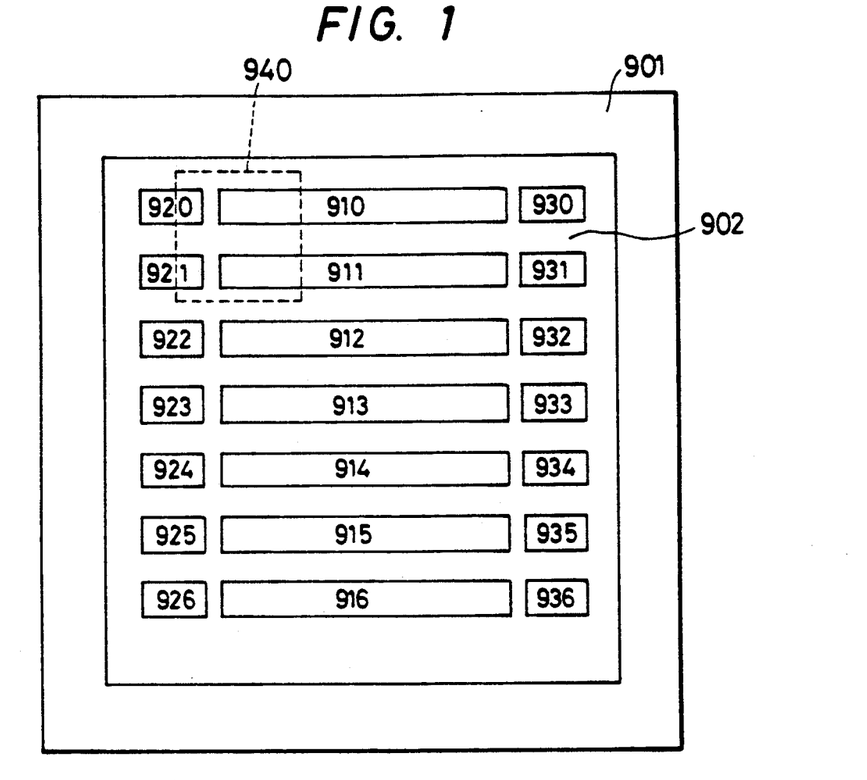
FIGS. 1, 6 to 8 and 10 to 15 are views employed to describe embodiments of the present invention.

FIG. 1 shows an arrangement of a master chip on which is formed a gate array wherein Bi-CMOS and CMOS gates are mixed together. The reference numeral 901 denotes a region for input and output drivers and bonding pads, and 902 a region for interconnection. Interconnection may be realized using a double-layer structure consisting of Al 1 and Al 2. The numerals 910 to 916 denote CMOS basic cells in which no bipolar transistor region is provided and therefore no Bi-CMOS gate can be formed and in which a CMOS gate can be formed using a CMOS transistor region alone. The numerals 930 to 936 and 920 to 926 denote Bi-CMOS basic cells in which a bipolar transistor region and a CMOS transistor region are provided and therefore a Bi-CMOS gate can be formed. In other words, a region for CMOS basic gates is provided in the center of the gate array, and regions for Bi-CMOS basic gates are provided on the right and left sides, respectively, of the CMOS basic gate region.

Figure 8:
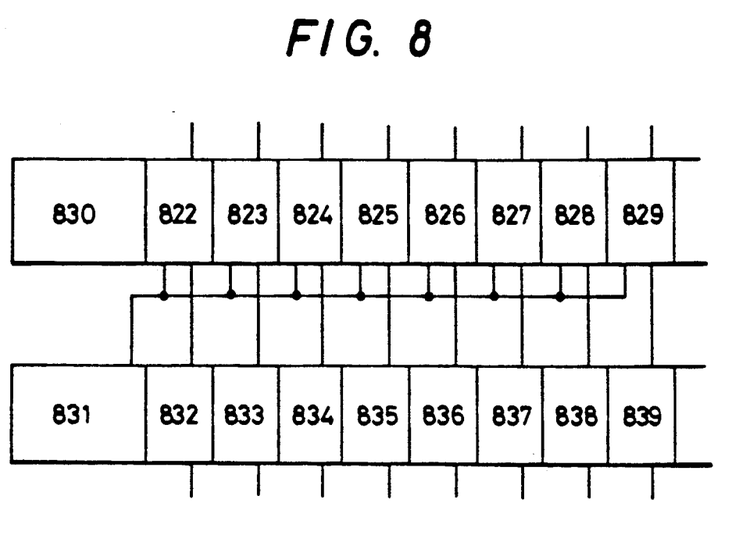

FIG. 8 shows an arrangement in which the logic shown in FIG. 7 is actually formed in a portion surrounded by the chain line in FIG. 1. The reference numerals 832 to 839 and 822 to 829 denote conventionally known CMOS basic gates which are internally connected within the cells so that the basic gates 832 to 839 define inverters and the basic gates 822 to 829 define two-input NAND gates, respectively. In FIG. 8, the lower side of each cell defines the input side and the upper side thereof defines the output side for the purpose of facilitating the description. In general gate arrays, input and output terminals can be placed on both the upper and lower sides of each cell, and in such case also, the present invention is effectively employed.

The reference numerals 830 and 831 denote Bi-CMOS basic gates such as those described in the specifications of European Patent Laid-Open Nos. 0099100 1/1984 and 0132822 2/1985, etc. The basic gate 831 is internally connected so as to define an inverter.

The basic gates 831, 832 to 839 and 822 to 829 shown in FIG. 8 respectively correspond to the logic elements 731, 732 to 739 and 722 to 729 shown in FIG. 7. In FIG. 8, each Bi-CMOS basic cell has an area double the area of each CMOS basic cell.

In the embodiment shown in FIG. 8, the Bi-CMOS inverter 831 is allotted to the inverter 731 since the load of the inverter 731 is relatively heavy. In this way, the operation speed of the gate array in accordance with this embodiment is allowed to be higher than that of a gate array consisting of CMOS basic cells alone. It will be understood from FIG. 5 that, if the load of the inverter 731 is on the order to 0.8 pF, employment of a Bi-CMOS inverter to define the inverter 731 enables the operation speed to be doubled.

When a gate array is formed using Bi-CMOS basic cells alone, it is possible to obtain the same performance as that of a gate array consisting of Bi-CMOS and CMOS basic cells which are mixed together. In such case, however, an area which is approximately double the area of the latter gate array is needed. More specifically, a gate array in which Bi-CMOS basic cells and CMOS basic cells are mixed has the advantage that it can operate at a high speed equal to that of a gate array consisting of Bi-CMOS basic cells alone and has a large scale of integration which is equal to that of a gate array consisting of CMOS basic cells alone.

Figure 10:
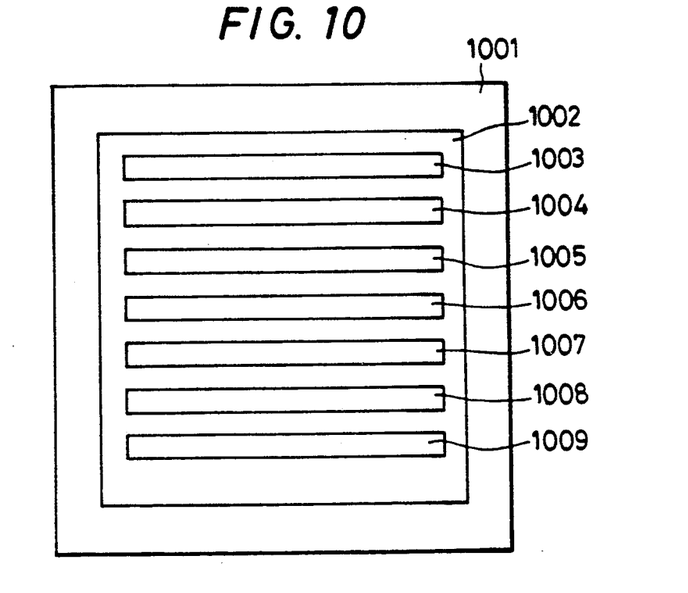

FIG. 10 shows another embodiment of a gate array master chip on which Bi-CMOS and CMOS basic cells are mixedly arranged. The reference numeral 1001 denotes a region for input and output buffers and bonding pads, 1002 a region for interconnection, 1003, 1009 rows of Bi-CMOS basic cells, and 1004 to 1008 rows of CMOS basic cells. More specifically, the uppermost row and the lowermost row are respectively defined by rows of Bi-CMOS basic cells. In this case, since basic gates of the same kind alone are arranged horizontally as viewed in FIG. 10, it is advantageously unnecessary for Bi-CMOS and CMOS basic cells to have the same height as each other.

Although in the arrangements shown in FIGS. 1 and 10 only eight rows of basic cells are provided on a chip, the present invention is effectively employed also in the case where nine or more rows of basic cells are arranged on a chip.

In the examples shown in FIGS. 1 and 10, the Bi-CMOS region and the CMOS region are separated from each other on the master chip. Recently, integrated circuits are often designed according to the standard cell system in order to increase the scale of integration.

The standard cell system enables a large-scale logic such as a ROM or an adder to be handled as one macro cell.

Figure 11:
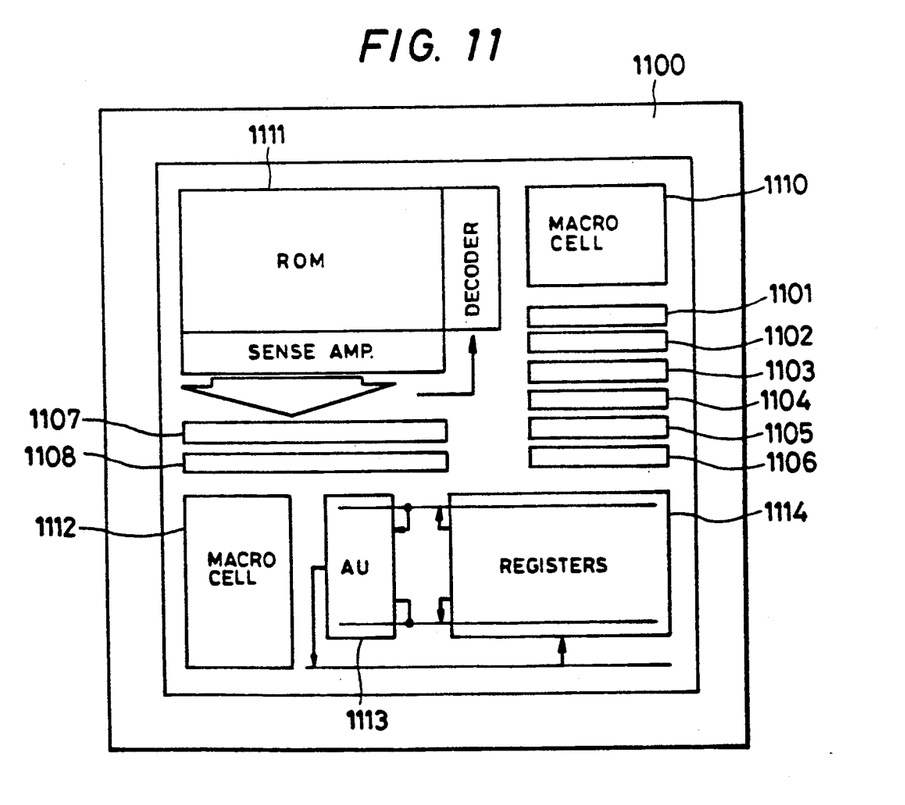

FIG. 11 shows an embodiment in which the present invention is applied to a customized LSI of the standard cell system.

The reference numeral 1100 denotes a region for input and output buffers, and 1101 to 1108 rows of basic cells known as polycells. Polycells are basic cells of uniform height having a scale of several to several tens of gates. The numerals 1110 to 1114 denote macro cells. Macro cells have a larger logic scale than that of the polycells and include a ROM, register, adder (AU), etc. In an LSI of the standard cell system, regular logics such as a ROM, RAM, register, adder, etc. are defined by macro cells, and other random logics are defined by polycells.

In this polycell portion, a critical path is constituted by polycells including Bi-CMOS gates, while a portion other than the critical path is constituted by polycells defined by CMOS basic cells, whereby a high-speed and high-packing density LSI can be formed in a manner similar to that in the case of the above-described gate array.

In the case where a part of the critical path is constituted by macro cells, two or more kinds of macro cell which constitute the same logic are employed as these macro cells, whereby it is advantageously possible to increase the operation speed and the scale of integration or reduce the power consumption in a manner similar to that in the case of the above-described random logic.

More specifically, a portion which defines a critical path is formed using macro cells which have a relatively large area or a relatively high power consumption but which operate at relatively high speed, whereas a portion which does not define a critical path is formed using macro cells which operate at relatively low speed but which have a relatively small area or a relatively low power consumption, whereby it is possible to produce a chip which advantageously has a high-speed operation and a large scale of integration or a low power consumption as a whole.

It is advantageous to design a high-speed macro cell using a composite structure consisting of bipolar and CMOS transistors, since there is generally the tendency that, as the operation speed is increased, the chip area and power consumption increase in a manner similar to that in the case of basic gates. Thus, the present invention is also effective in designing such macro cell.

Figure 13:
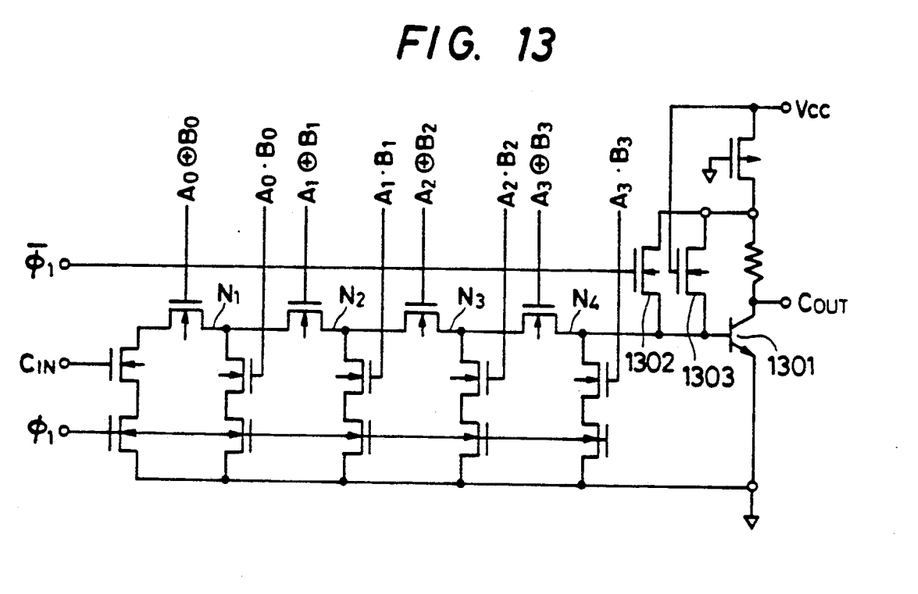

An example in which an adder is constituted by macro cells will be explained below. In an adder, a critical path is defined by a carry propagation circuit which propagates a carry during addition. FIG. 13 shows a 4-bit high-speed carry propagation circuit which is constituted by a mixture of bipolar and MOS basic gates. The circuit is adapted to check 4-bit data items A and B and a carry $C_{in}$ from a lower-order digit and deliver a carry signal $C_{out}$ to a higher-order digit.

In the arrangement shown in FIG. 13, when the clock $\phi_1$ is "0", an NMOS transistor is ON and floating capacitors respectively formed at nodes $N_4$, $N_3$, $N_2$ and $N_1$ are thus charged. At this time, the potential is clamped by the base-emitter junction of a bipolar transistor 1301 and therefore reduced to about 0.8 V. When the clock $\phi_1$ is "1", if the condition of carry propagation is satisfied, the base current of the bipolar transistor 1301 is drawn out by the operation of MOS transistors, so that the bipolar transistor 1301 turns OFF and the output $C_{out}$ becomes high in potential. On the other hand, if the condition of carry propagation is not satisfied, the bipolar transistor 1301 continues ON and the output $C_{out}$ remains at the low potential. In this circuit, since the nodes $N_1$, $N_2$, $N_3$ and $N_4$ are maintained at a low amplitude (0.8V), the circuit operates at high speed, but when the condition of carry propagation is not satisfied, a current flows through the circuit and therefore the power consumption is relatively large.

Figure 14:
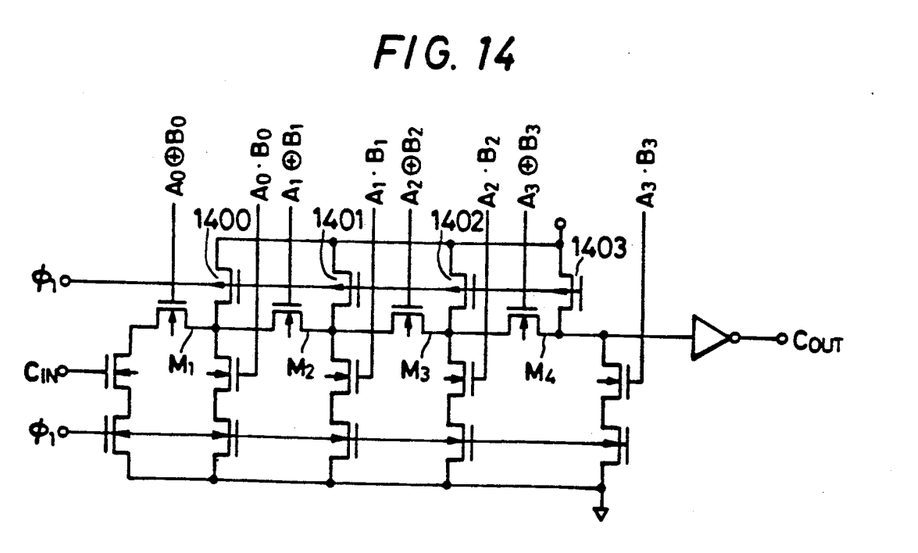

FIG. 14 is a diagram showing a carry propagation circuit which consists of MOS transistors alone. The logic and operation of this circuit are the same as those of the carry propagation circuit (shown in FIG. 13) which is constituted by a mixture of bipolar and MOS basic gates. More specifically, when the clock $\phi_1$ is "0", nodes $M_1$, $M_2$, $M_3$ and $M_4$ are changed to a power supply voltage, i.e., 5V, by the operation of PMOS transistors 1400, 1401, 1402 and 1403. When the clock $\phi_1$ is "1", if the condition of carry propagation is satisfied, the charge at the node $M_4$ is drawn out by the operation of any one of the NMOS transistors and the output $C_{out}$ becomes high in potential. On the other hand, if the condition of carry propagation is not satisfied, the charge at the node $M_4$ is not drawn out and the output $C_{out}$ is thus maintained at the low potential. In this circuit, the nodes $M_1$, $M_2$, $M_3$ and $M_4$ are charged to the power supply voltage, i.e., 5V, and the circuit therefore operates with a relatively large amplitude. Accordingly, although the operation speed of this circuit is relatively low, the power consumption is relatively small since no steady-state current flows through the circuit.

Although the above-described circuits are 4-bit carry propagation circuits, any carry propagation circuit involving five or more bits may also be arranged. For example, a 32-bit carry propagation circuit may be formed by connecting eight 4-bit carry propagation circuits in series.

If the above-described circuits are employed, it is possible to form on the same one chip a bipolar-CMOS composite adder which involves a high-speed operation and a large power consumption and a CMOS adder involving a low-speed operation and a low power consumption although these two different kinds of adder are defined by macro cells having the same logic function, that is, addition.

In an LSI of the standard cell system, a multiplicity of adder macro cells are generally present. In such arrangement, if a bipolar-CMOS composite adder is employed for a portion of the LSI which defines a critical path and a CMOS adder is employed for a portion of the LSI other than the critical path by means of automatic interconnection DA or the like, it is possible to obtain a chip which operates at high speed and involves a low power consumption as a whole.

Similar advantages are also obtained with respect to other combinations of macro cells, such as a combination of an SRAM consisting of bipolar and CMOS basic cells and an SRAM consisting of CMOS basic cells alone or a combination of a ROM consisting of bipolar and CMOS basic cells and a ROM consisting of CMOS basic cells alone.

Figure 12:
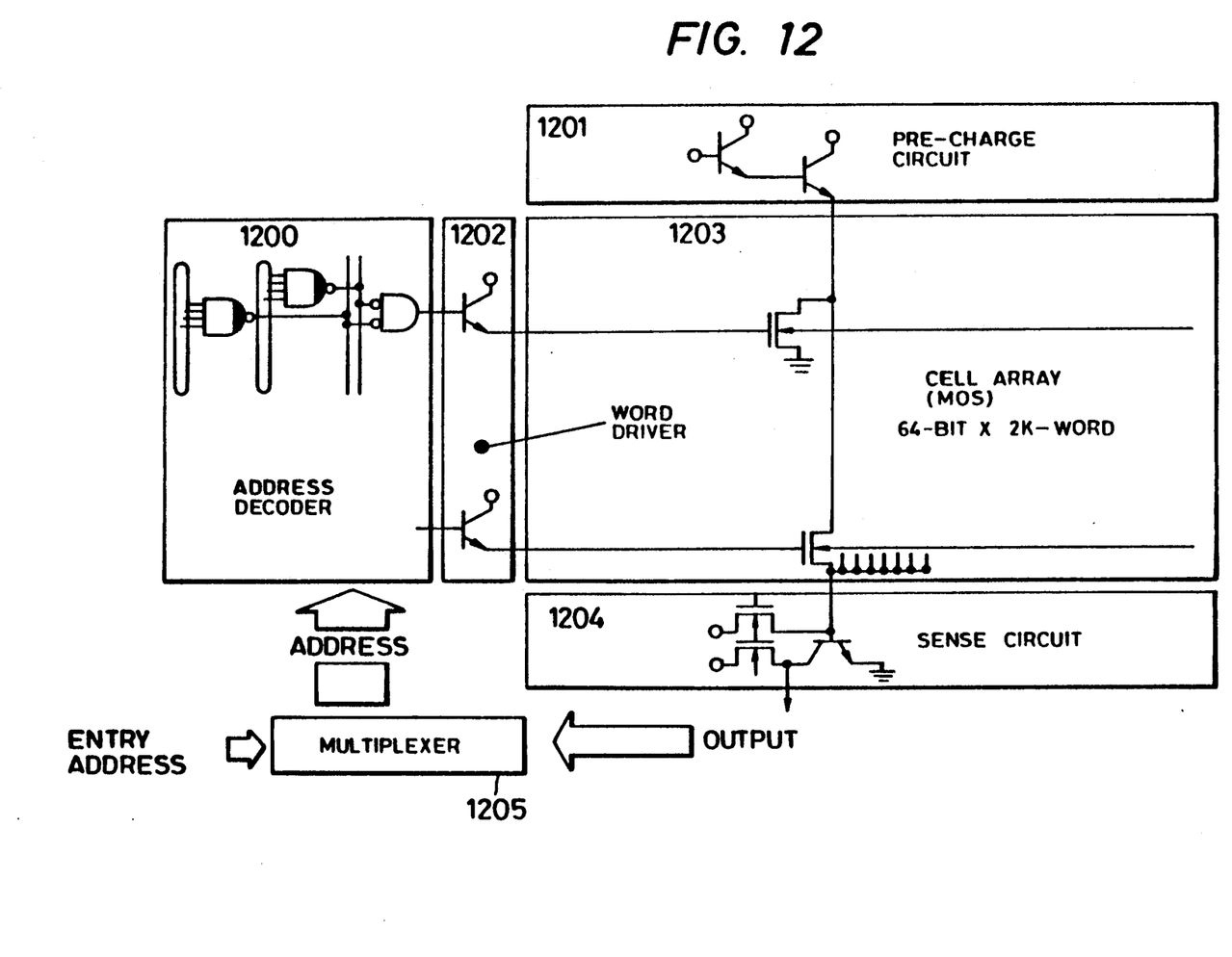

An arrangement of a bipolar-CMOS composite ROM is shown in FIG. 12. The reference numeral 1200 denotes an address decoder, 1202 a word driver, 1201 a pre-charge circuit, 1203 a memory cell array, 1204 a data line sense circuit, and 1205 a multiplexer for selecting an address.

Since word lines have a relatively heavy load, it is effective practice to employ a bipolar driver. Since the load of data lines is also relatively heavy, a pre-charge circuit constituted by bipolar transistors is employed. Further, since the fan-out of the address decoder 1200 is a relatively high number, it is constituted by Bi-CMOS basic gates. The sense circuit 1204 is defined by a bipolar sense amplifier which serves to suppress the voltage amplitude of data lines in the same manner as in the case of the above-described carry propagation circuit. Thus, a ROM is also constituted by a mixture of bipolar and CMOS transistors, and this enables provision of a ROM which has a higher power consumption than that of a CMOS ROM having the same function but can operate at higher speed than the latter.

A design technique wherein a macro cell including Bi-CMOS gates and a macro cell consisting of CMOS gates alone are mixedly employed will be explained below with reference to FIG. 15. After the function design, the logic design is carried out according to the function design. In the logic design, a desired logic is assembled using macro cells included in a prepared logic cell library. The logic cell library includes polycells such as inverters and 2-input NAND gates and macro cells such as selectors and counters each of which is formed using a plurality of polycells. The logic library may further include macro cells such as ROMs, RAMs and register files which are defined by regular logics that are designed optimally.

In the logic design step, a logic is assembled mainly noticing the function of each cell.

Figure 15:
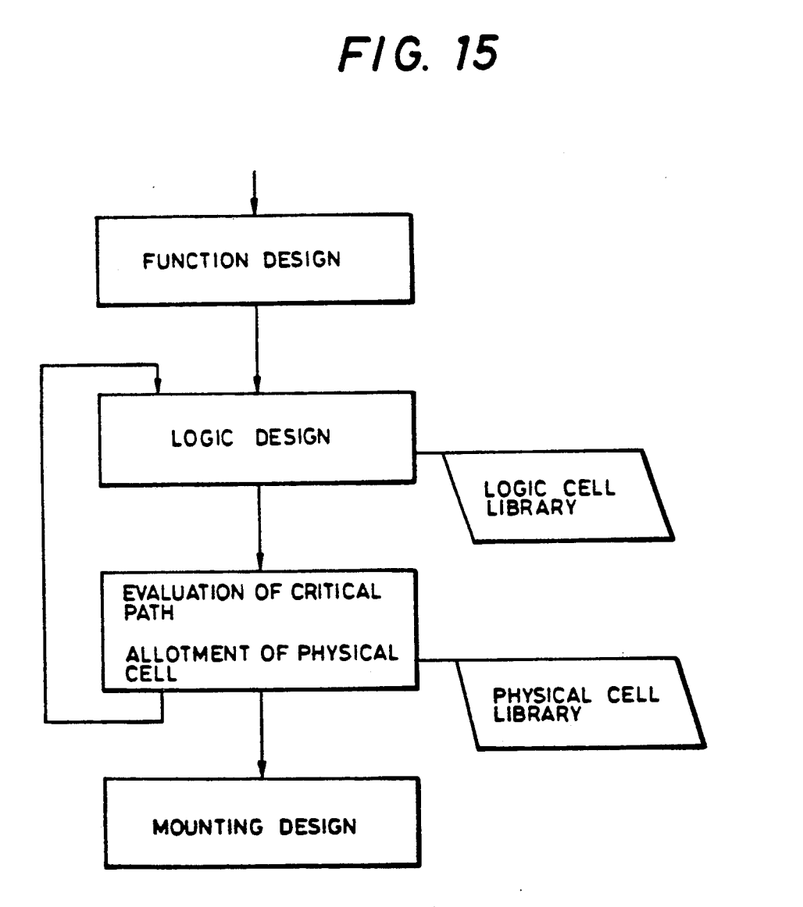

When the logic design has generally been completed, allotment of physical cells to logic cells and evaluation of the critical path are effected (as per the block EVALUATION OF CRITICAL PATH - ALLOTMENT OF PHYSICAL CELL in FIG. 15). This operation is carried out while referring to a physical cell library. In the physical cell library, a plurality of physical cells are prepared for one kind of logic cell. This set of a plurality of physical cells includes a basic macro cell consisting of CMOS gates alone and a basic macro cell consisting of bipolar and CMOS gates.

Since the chip area is preferably reduced as much as possible, physical cells consisting of CMOS gates alone are employed first to see if predetermined delay specifications can be met when CMOS-only gates are used. When the evaluation of the critical path finds that the delay specifications are not satisfied with CMOS-only gates, a portion of the chip which defines the critical path is replaced by a physical cell including bipolar and CMOS gates. The circuit is then re-tested to see if the delay specifications are satisfied. If the specification is still not satisfied even by this replacement, (i.e., the delay time on the critical path is too great) the process returns to the logic design step.

As has been described above, a plurality of kinds of physical cells having the same function are prepared, and these cells are effectively allotted to a portion which defines a critical path and a portion other than the critical path, whereby a high-speed and high-packing density LSI can be realized. In addition, since it is unnecessary to take care of the kind of physical cell in the logic design step, designing is facilitated.

According to the present invention, a Bi-CMOS basic cell and a Bi-CMOS macro cell can be employed to define a critical path, and this enables an increase in the operation speed, advantageously. In addition, since a CMOS basic cell and a CMOS macro cell can be employed for a portion of the chip other than the critical path, it is advantageously possible to enlarge the scale of integration.

More specifically, it is possible, according to the present invention, to produce a gate array which has a performance equal to that of a Bi-CMOS gate array and a scale of integration equal to that of a CMOS gate array.

Further, according to the present invention, it is possible to produce a standard cell type LSI which can operate at a speed equal to that of a Bi-CMOS macro cell and which involves a power consumption and a scale of integration equal to those of a CMOS macro cell.

What is claimed is:

1. A method of manufacturing a standard cell semiconductor integrated circuit device incorporating a first macro cell including CMOS gates without bipolar gates and a second macro cell including bipolar and CMOS gates comprising:

a function design step;

a logic design step where a desired logic according to said function design step is assembled using logical macro cells included in a prepared logical cell library;

evaluating a plurality of paths for said semiconductor integrated circuit device, and determining at least a first path which has a delay time greater than a predetermined delay time specification;

allotting physical cells to the logical macro cells with reference to a physical cell library where a set of a plurality of physical cells having the same logic function including the first macro cell and the second macro cell are prepared, wherein the first macro cell is allotted in areas of said integrated circuit other than said first path and wherein the second macro cell is allotted in a portion of the integrated circuit which defines said first path to reduce delay time along said first path; and returning to said logic design step when the predetermined delay time specification is not satisfied even by the allotment of the second macro cell in said first path.

2. A method of manufacturing according to claim 1, wherein the first path has the largest delay time of the plurality of evaluated paths.

3. A method of manufacturing a standard cell semiconductor integrated circuit device incorporating a first polycell including CMOS gates without bipolar gates and a second polycell including bipolar and CMOS gates comprising:

a function design step;

a logic design step where a desired logic according to said function design step is assembled using logical polycells included in a prepared logical cell library;

evaluating a plurality of paths for said semiconductor integrated circuit device, and determining at least a first path which has a delay time greater than a predetermined delay time specification;

allotting physical cells to the logical polycells with reference to a physical cell library where a set of a plurality of physical cells having the same logic function including the first polycell and the second polycell are prepared, wherein the first polycell is allotted in areas of said integrated circuit other than said first path and the second polycell is allotted in a portion of the integrated circuit which defines said first path to reduce delay time along said first path; and returning to said logic design step when the predetermined delay time specification is not satisfied even by the allotment of the second polycell in said first path.

4. A method of manufacturing according to claim 3, wherein the first path has the largest delay time of the plurality of evaluated paths.

5. A method of manufacturing a standard cell semiconductor integrated circuit device incorporating a first macro cell including CMOS gates without bipolar gates, a second macro cell including bipolar and CMOS gates, a first polycell including CMOS gates without bipolar gates and a second polycell including bipolar and CMOS gates comprising:

a function design step;

a logic design step where a desired logic according to said function design step is assembled using logical macro cells and logical polycells including in a prepared logic cell library;

evaluating a plurality of paths for said semiconductor integrated circuit device, and determining at least a first path which has a delay time greater than a predetermined delay time specification;

allotting physical cells to the logical macro cells with reference to a physical cell library where a set of a plurality of physical cells having the same logic function including the first macro cell and the second macro cell are prepared, wherein the first macro cell is allotted in areas of said integrated circuit other than said first path and the second macro cell is allotted in a portion of the integrated circuit which defines said first path to reduce delay time along said first path;

allotting physical cells to the logical polycells with reference to a physical cell library where a set of a plurality of physical cells having the same logic function including the first polycell and the second polycell are prepared, wherein the first polycell is allotted in areas of said integrated circuit other than said first path and said second polycell is allotted in a portion of the integrated circuit which defines said first path to reduce delay time along said first path; and returning to said logic design step when the predetermined delay time specification is not satisfied even by the allotment with the second macro cell and the second polycell in said first path.

6. A method of manufacturing according to claim 5, wherein the first path has the largest delay time of the plurality of evaluated paths.

* * * * *